(12) United States Patent
Takeda et al.

(10) Patent No.: US 9,039,475 B2
(45) Date of Patent: May 26, 2015

(54) MANUFACTURING METHOD OF LIGHT EMITTING DEVICES

(75) Inventors: Shigeo Takeda, Kiyosu (JP); Makoto Ishida, Kiyosu (JP); Mitsushi Terakami, Kiyosu (JP); Shota Yamamori, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 13/527,445

(22) Filed: Jun. 19, 2012

(65) Prior Publication Data

US 2013/0005210 A1   Jan. 3, 2013

(30) Foreign Application Priority Data

Jun. 30, 2011   (JP) ................................. 2011-145665

(51) Int. Cl.
*H01L 33/00*  (2010.01)
*H01L 33/48*  (2010.01)
*H01L 33/54*  (2010.01)
*H01L 21/78*  (2006.01)
*H01L 23/00*  (2006.01)

(52) U.S. Cl.
CPC ....... *H01L 24/97* (2013.01); *H01L 2224/48091* (2013.01); *H01L 2224/48227* (2013.01); *H01L 2224/48247* (2013.01); *H01L 2224/48464* (2013.01); *H01L 2224/49107* (2013.01); *H01L 2224/92247* (2013.01); *H01L 2924/3025* (2013.01); *H01L 2924/07802* (2013.01); *H01L 2924/12041* (2013.01)

(58) Field of Classification Search
USPC ................... 445/24–25; 438/110–113, 26, 28
See application file for complete search history.

(56) References Cited

U.S. PATENT DOCUMENTS

| | | | | |
|---|---|---|---|---|
| 5,612,513 A | * | 3/1997 | Tuttle et al. | 174/260 |
| 6,020,218 A | * | 2/2000 | Shim et al. | 438/111 |
| 6,057,597 A | * | 5/2000 | Farnworth et al. | 257/710 |
| 6,469,382 B1 | * | 10/2002 | Hotozuka et al. | 257/724 |

(Continued)

FOREIGN PATENT DOCUMENTS

| | | | | |
|---|---|---|---|---|
| JP | 10135254 A | * | 5/1998 | |
| JP | H 11-074410 A | | 3/1999 | |
| JP | 2000196177 A | * | 7/2000 | |
| JP | 2003-101070 A | | 4/2003 | |

(Continued)

OTHER PUBLICATIONS

Japanese Office Action dated Jul. 15, 2014 with English Translation.

*Primary Examiner* — Mariceli Santiago
(74) *Attorney, Agent, or Firm* — McGinn IP Law Group, PLLC

(57) ABSTRACT

A manufacturing method of light emitting devices, comprises a substrate-forming step of forming a planar-shaped substrate, a frame-forming step of forming a closed frame on the substrate, an element-mounting step of mounting multiple light emitting elements in an inside of the frame, a sealing step of injecting a liquid material that is to be a sealing member to the inside of the frame so as to seal the multiple light emitting elements, and a dividing step of dividing the multiple light emitting elements together with the substrate and the sealing member so as to obtain multiple light emitting devices with the sealing member exposed from a side surface thereof.

20 Claims, 8 Drawing Sheets

(56) References Cited

U.S. PATENT DOCUMENTS

| | | | |
|---|---|---|---|
| 6,589,814 B1* | 7/2003 | Mostafazadeh et al. | 438/112 |
| 6,638,780 B2* | 10/2003 | Fukasawa et al. | 438/26 |
| 6,908,784 B1* | 6/2005 | Farnworth et al. | 438/113 |
| 7,268,016 B2* | 9/2007 | Minamio et al. | 438/110 |
| 7,534,663 B2* | 5/2009 | Ogawa et al. | 438/113 |
| 2004/0212295 A1* | 10/2004 | Yin Chua et al. | 313/503 |

FOREIGN PATENT DOCUMENTS

| | | |
|---|---|---|
| JP | 2005-026296 A | 1/2005 |
| JP | 2008-027999 A | 2/2008 |
| JP | 2008-270314 A | 11/2008 |
| JP | 2010-129985 A | 6/2010 |
| JP | 2010-177329 A | 8/2010 |
| WO | WO 2010-147178 A1 | 12/2010 |

* cited by examiner

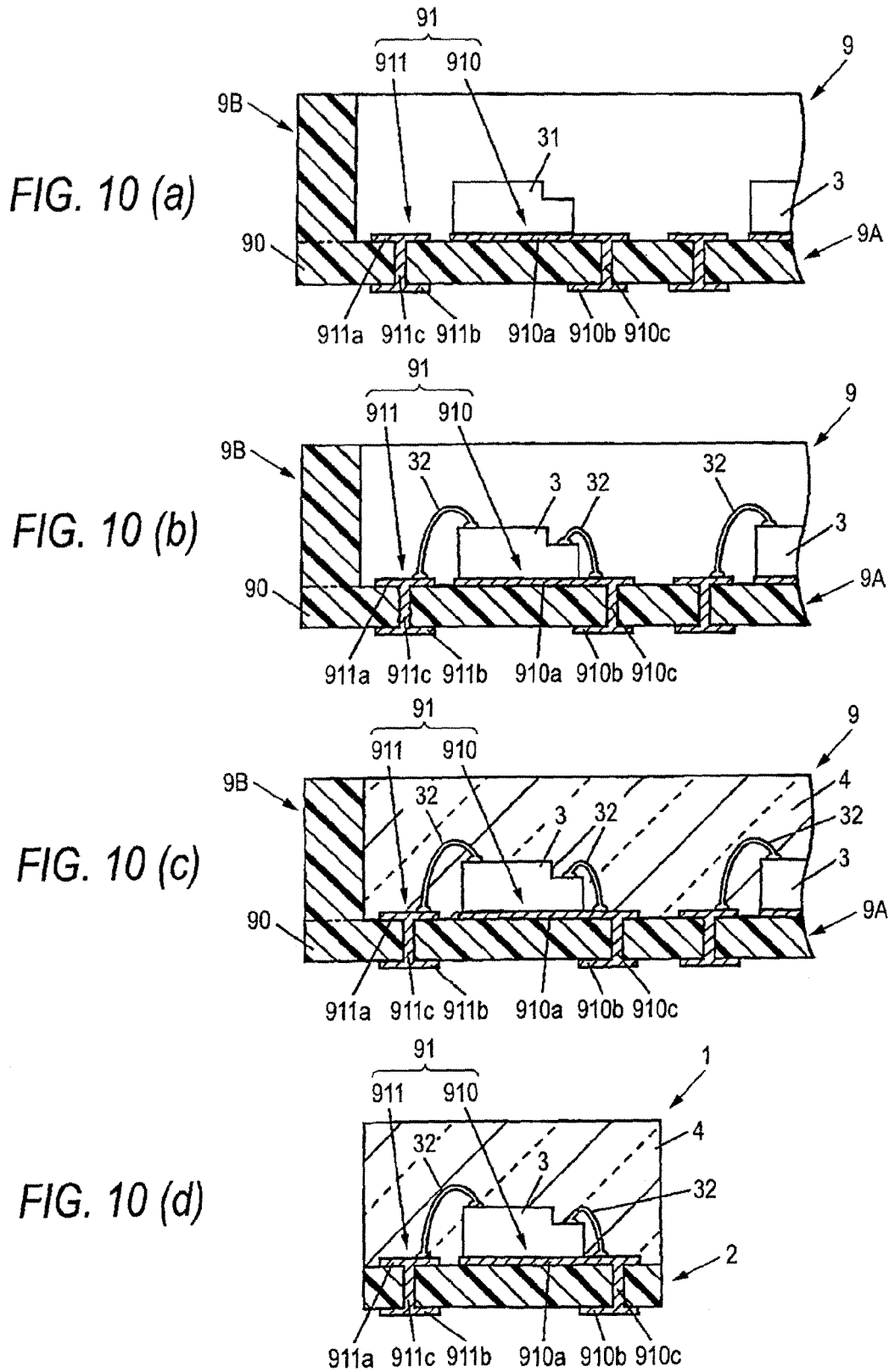

MANUFACTURING METHOD OF LIGHT EMITTING DEVICES

BACKGROUND OF THE INVENTION

1. Field of the Invention

The present invention relates to a manufacturing method of light emitting devices, wherein light emitting elements are mounted on element-mounting units.

2. Description of the Related Art

The conventional light emitting device has an element-mounting substrate having element-mounting units, light emitting diode (LED) elements as the light emitting elements mounted on the element-mounting units of the element-mounting substrate, and a sealing member for sealing the LED elements.

Manufacturing of the light emitting element is carried out using an element assembling mounting substrate, such as a lead frame having multiple element-mounting units and multiple pairs of wire connecting units insulated from each other (see Patent Reference 1).

That is, in manufacturing of the light emitting device using the lead frame, the light emitting elements are mounted on multiple element-mounting units; then, the light emitting elements are connected to the multiple pairs of the wire connecting units by wires. Then, the light emitting elements are sealed together with the wires by the sealing member, and the sealing member and the lead frame are divided. In this case, when the light emitting elements and wires are sealed by the sealing member, after the lead frame having elements mounted and wire connection performed is set in a mold, a liquid resin as the sealing member is injected into the cavity of the mold and is cured.

Patent Reference 1: JP-A-2010-177329

However, according to the manufacturing method of the light emitting device using a lead frame as described in Patent Reference 1, it is impossible to realize mounting of the light emitting elements at a high density on the element-mounting units, and, in addition, it is necessary to use a complicated equipment using a mold, making it difficult to realize low cost.

SUMMARY OF THE INVENTION

Consequently, an object of the present invention is to provide a light emitting device, wherein it is possible to realize mounting of the light emitting elements in a high density with respect to the element-mounting units, and, at the same time, there is no need to use a complicated equipment using a mold for sealing the light emitting elements, so that it is possible to avoid from the obstacle to reduce cost.

The manufacturing method of the light emitting device in (1) through (6) is provided as an embodiment of the present invention in order to realize the object.

(1) A manufacturing method of light emitting devices, comprising a substrate-forming step of forming a planar-shaped substrate, a frame-forming step of forming a closed frame on the substrate, an element-mounting step of mounting multiple light emitting elements in an inside of the frame, a sealing step of injecting a liquid material that is to be a sealing member to the inside of the frame so as to seal the multiple light emitting elements, and a dividing step of dividing the multiple light emitting elements together with the substrate and the sealing member so as to obtain multiple light emitting devices with the sealing member exposed from a side surface thereof.

(2) The manufacturing method of light emitting devices according to (1), wherein the substrate includes a resin composite lead frame.

(3) The manufacturing method of light emitting devices according to (2), wherein the frame gradually tapers larger from a side of the substrate.

(4) The manufacturing method of light emitting devices according to (2), wherein the frame gradually tapers smaller from a side of the substrate.

(5). The manufacturing method of light emitting devices according to (2), wherein the frame has two wall portions of an inner wall portion and an outer wall portion.

(6). The manufacturing method of light emitting devices according to (2), wherein the substrate-forming step and the frame-forming step are carried out simultaneously.

According to the present invention, it is possible to realize high-density mounting of light emitting elements with respect to the element-mounting units, and, at the same time, there is no need to use a complicated equipment using a mold for sealing of the light emitting elements, so that it is possible to avoid the obstacle to low cost.

BRIEF DESCRIPTION OF THE DRAWINGS

FIG. 3(a) is a plane view, and FIG. 3(b) is a cross-sectional view.

FIG. 4(a) shows the plating treatment step, FIG. 4(b) shows the LED element-mounting step. FIG. 4(c) shows the wire bonding step. FIG. 4(d) shows the sealing step, and FIG. 4(e) shows the dicing step.

FIG. 8(a) shows Modified Example 1, and FIG. 8(b) shows Modified Example 2.

FIG. 9(a) is a plane view, and FIG. 9(b) is a cross-sectional view.

FIGS. 10(a) through 10(d) are cross-sectional views illustrating the manufacturing method of light emitting devices using the element assembling mounting substrate related to Embodiment 1 of the present invention. FIG. 10(a) shows the LED element-mounting step, FIG. 10(b) shows the wire bonding step, FIG. 10(c) shows the sealing step, and FIG. 10(d) shows the dicing step.

DESCRIPTION OF THE PREFERRED EMBODIMENTS (Embodiment 1)

In the following, the element assembling mounting substrate and the manufacturing method of light emitting devices using the same related to Embodiment 1 of the present invention will be explained in detail with reference to the drawings.
(Overall Constitution of the Light Emitting Device)

Figure 1:
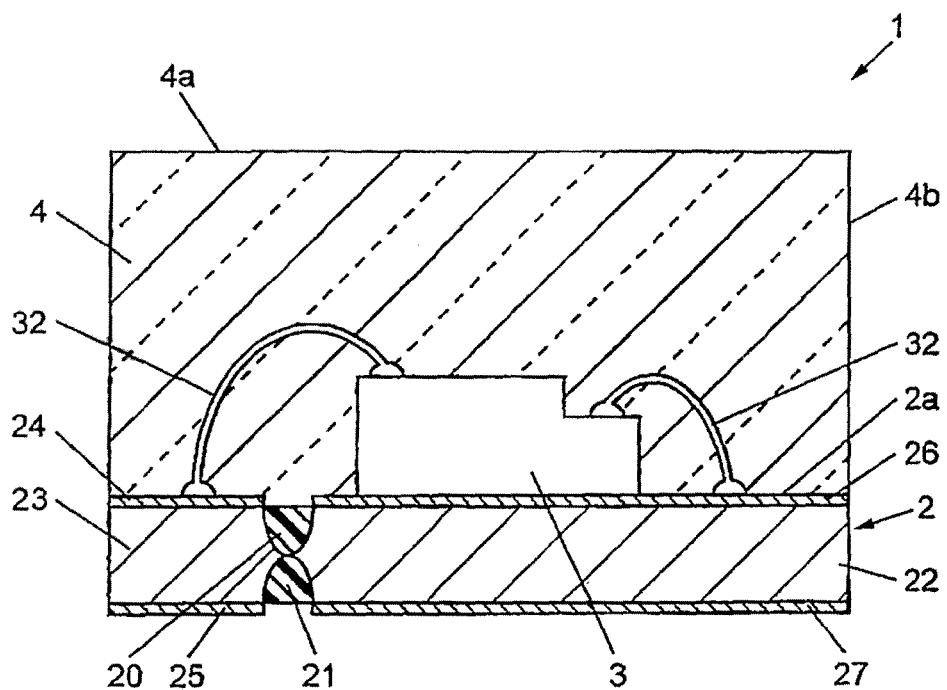
FIG. 1 is a cross-sectional view illustrating the light emitting device manufactured using an element assembling mounting substrate related to Embodiment 1 of the present invention.

FIG. 1 shows the light emitting device. As shown in FIG. 1, the light emitting device 1 roughly comprises an element-mounting substrate 2, a LED element 3 mounted on the element-mounting substrate 2, and a sealing member 4 that seals the LED element 3.
(Constitution of Element-Mounting Substrate 2)

Here, the element-mounting substrate 2 is a portion of a plate-shaped element assembling mounting substrate 5 (shown in FIG. 3) adopted in manufacturing the light emitting device 1, and it has conductor pads 22, 23 as a pair of conductor members insulated from each other by a first insulating member 20 and a second insulating member 21. It is formed as a quadratic prism with an overall planar rectangular shape. The thickness of the element-mounting substrate 2 is set at the dimension of about 1.0 mm. Details of the element assembling mounting substrate 5 will be described later.

The first insulating member 20 is arranged on one side (element-mounting side) of the element-mounting substrate 2 and on the other side (element non-mounting side) of the element-mounting substrate 2. Examples of the materials for making the first insulating member 20 and the second insulating member 21 include the light shielding materials, such as polyamide and other thermoplastic resins, epoxy resin, silicone and other thermosetting resins, as well as alumina and other ceramics. Silicone resin is adopted in this embodiment.

A pair of conductor pads 22, 23 is set adjacent to each other via the first insulating member 20 and the second insulating member 21, and they are set side-by-side on the face direction of the element-mounting substrate 2. One of the conductor pad 22 is formed by the pad for element-mounting and wire connection, and the other conductor pad 23 is formed by the pad for wire connection.

On the outer/back surfaces of one conductor pad 22, plating treatment portions 24, 25 are arranged by carrying out plating treatment using silver (Ag) or the like. On the outer/back surfaces of the other conductor pad 23, plating treatment portions 26, 27 are arranged by carrying out plating treatment using Ag or the like just as for the one conductor pad 22. On the outer surface of the one conductor pad 22, the n-side electrode 31 (to be explained later) of the LED element 3 is connected via the plating treatment portion 26, and, on the outer surface of the other conductor pad 23, the p-side pad electrode 30a (to be explained later) of the LED element 3 is connected via the plating treatment portion 24. The power supply voltage is fed to the LED element 3 via the plating treatment portion 27 on the back surface of the one conductor pad 22, and via the plating treatment portion 25 on the back surface of the other conductor pad 23, respectively. For example, the materials for making the pair of conductor pads 22, 23 include metals, such as copper alloys and iron alloys.
(Constitution of the LED Element 3)

Figure 2:
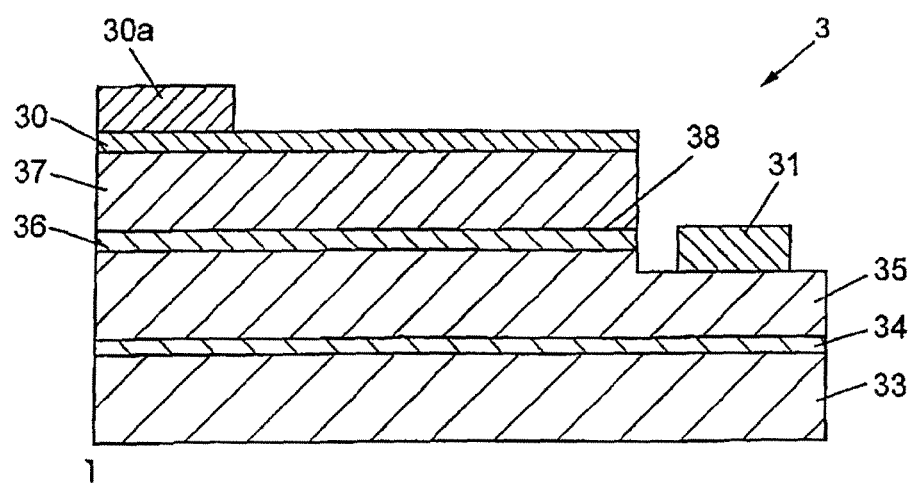
FIG. 2 is a cross-sectional view illustrating the LED element of the light emitting device manufactured using the element assembling mounting substrate related to Embodiment 1 of the present invention.

FIG. 2 shows the LED element. As shown in FIG. 2, the LED element 3 has a p-side electrode 30 and an n-side electrode 31. As the p-side electrode 30 (p-side pad electrode 30a) is connected to the plating treatment portion 24, and the n-side electrode 31 is connected to the plating treatment portion 26, respectively, by wires 32 (shown in FIG. 1), the LED element is mounted on nearly the central portion of the element-mounting surface of the element-mounting substrate 2 (shown in FIG. 1). For example, the LED element 3 may be a blue-color LED element with a nearly square planar shape.

For the LED element 3, by subjecting the group-III nitride-type semiconductor to epitaxial growth on the outer surface of the substrate 33 made of sapphire ($Al_2O_3$) at, for example, 700° C., it is configured so that a buffer layer 34, an n-type semiconductor layer 35, an MQW (Multiple Quantum Well) layer 36 as the light emitting layer, and a p-type semiconductor layer 37 are sequentially formed, and the constitution can emits blue light with the peak light emitting wavelength in the range of, for example, 460 nm to 463 nm emitted from the light emitting surface 38.

The p-side electrode 30 has a p-side pad electrode 30a, and it is arranged on the back surface of the p-type semiconductor layer 37. The n-side electrode 31 is arranged on the portion (n-type semiconductor layer 35) exposed by carrying out etching treatment for a portion from the p-type semiconductor layer 37 to the MQW layer 36 and the n-type semiconductor layer 35. The material of the p-side electrode 30 is a transparent electro-conductive material made of ITO (indium tin oxide) or other oxide, and the materials for making the p-side pad electrode 30a and the n-side electrode 31 include Ni/Au, Al, and other metals.
(Constitution of the Sealing Member 4)

The sealing member 4 is a quadratic prism shaped synthetic resin member with a rectangular planar shape (end surface 4a) and, at the same time, with each its side surface 4b in a rectangular shape. Each side surface 4b is arranged on the same plane as the side surface of the element-mounting substrate 2, and it is bonded to the element-mounting surface of the element-mounting substrate 2. Here, the sealing member 4 has a structure that ensures sealing of the LED element 3 on the element-mounting substrate 2. The materials of the sealing member 4 include the silicone base optical transmissive resins as well as, for example, optically transparent acrylic resins.
(Constitution of the Element Assembling Mounting Substrate 5)

The element assembling mounting substrate 5 will be explained in the following text with reference to FIGS. 3(a) and 3(b). As shown in FIGS. 3(a) and 3(b), the element assembling mounting substrate 5 comprises a substrate feed material 5A and a frame member 5B, and it is formed in an overall box member in a planar rectangular shape with opening on one side. In this way, when the light emitting device 1 (shown in FIG. 1) is manufactured, the liquid resin as the liquid material that becomes the sealing member 4 can be injected with respect to the element assembling mounting substrate 5. Formation of the element assembling mounting substrate 5 is carried out by bonding the frame member 5B on the element-mounting side end edge (the 4-side end edge) of the substrate feed material 5A (base member 50).

The substrate feed material 5A has a base member 50, a conductor member 51 and an insulating member 52. It is formed as an overall plate-shaped member with a planar rectangular shape. On the substrate feed material 5A, the "resin composite lead frame" described in the Patent Reference 1 is used. Formation of the substrate feed material 5A is carried out as follows: etching treatment is carried out from the back surface side of a metal plate (made of copper alloy or iron alloy) to form the first recession portion. In the first recession portion, screen printing is carried out to fill the first insulating member 20. Then, etching treatment is carried out from the back surface side of the metal plate to form the second recession portion. In the second recession portion, screen printing is carried out to fill the second insulating member 21.

The base member 50 forms a portion of the metal plate, and it is arranged on the 4-side end edge of the substrate feed material 5A. Here, base member 50 is formed from quadrangle frames in a planar rectangular shape each with the lateral and longitudinal dimensions different from each other (in this embodiment, the width is larger than the longitudinal dimension).

The conductor member 51 is made of multiple pairs (such as 15 pairs in the longitudinal direction and 14 pairs in the lateral direction) of conductor pads 22, 23 that form a portion of the metal plate just as the base member 50, with the conductor pads arranged side-by-side in the longitudinal and lateral directions on the plane. Here, conductor member 51 is formed so that together with the insulating member 52, it closes a portion of the opening of the frame member 5B. The two conductor pads 22, 23 are insulated from each other by the first insulating member 20 and the second insulating member 21. One of the conductor pad 22 is formed as the wire connecting pad as an element-mounting/wire connecting pad, and the other conductor pad 23 is formed as a wire connecting pad.

The insulating member 52 comprises the first insulating member 20 and the second insulating member 21, which are arranged side-by-side in the thickness direction of the element assembling mounting substrate 5. The first insulating member 20 is arranged in the upper portion of the insulating member 52, and the second insulating member 21 is arranged in the lower portion of the insulating member 52. Here, the insulating member 52 is formed such that multiple pairs of conductor pads 22, 23 are partitioned, respectively.

The frame member 5B is bonded with the element-mounting side end surface of the base member 50, and it is formed as a quadrangle frame with a planar shape nearly identical to the planar shape of the base member 50. Its entirety is opened in the thickness direction, and the opening portion on the element-mounting side is closed. The opening size of the frame member 5B is set to be an opening size that is nearly even from the element-mounting opening portion to the other-side opening portion. As far as the material of the frame member 5B is concerned, the same material (silicone resin) as that for making the insulating member 52 is adopted. As a result, the element assembling mounting substrate 5 works as a box member, and it is possible to inject a liquid resin as the sealing member 4 thereinto.

(Manufacturing Method of the Light Emitting Device 1)

The manufacturing method of the light emitting device 1 shown in the present embodiment will be explained in the following section with reference to FIGS. 4(a) through 4(e). Here, FIGS. 4(a) through 4(e) illustrate the manufacturing procedure of the light emitting device.

Various steps of operation, namely, "plating treatment", "mounting of LED elements", "wire bonding", "sealing of LED elements", and "dicing", are carried out sequentially in the manufacturing method of the light emitting device shown in the present embodiment. Consequently, these steps of operation will be explained in order in the following section.

(Plating Treatment)

As shown in FIG. 4(a), the plating treatment portions 26, 27 are arranged by plating treatment on the outer/back surfaces of one conductor pad 22 on the element assembling mounting substrate 5. Similarly, the plating treatment portions 24, 25 are arranged by plating treatment on the outer/back surfaces of the other conductor pad 23 on the element assembling mounting substrate 5.

(Mounting of LED Elements)

As shown in FIG. 4(b), an insulating adhesive, such as epoxy resin or the like (not shown), is used to bond the LED elements 3 via the plating treatment portion 26 on one of the conductor pad 22 on the back side of the frame member 5B on the element assembling mounting substrate 5. In this case, bonding of the LED elements 3 is carried out such that the light output side is oriented from the p-side pad electrode 30a and the n-side electrode 31 (both shown in FIG. 1) (the so-called face-up mounting configuration). As a result, multiple (a total of 210=14 in the longitudinal direction×15 in the lateral direction in the present embodiment) LED elements 3 are mounted in the element assembling mounting substrate 5.

(Wire Bonding)

As shown in FIG. 4(c), for example, an electro-conductive adhesive containing silver powder is used to connect each LED element 3 to the plating treatment portion 24 on the conductor pad 23 and the plating treatment portion 26 on the conductor pad 22 by means of the wires 32. In this case, the p-side pad electrode 30a is connected to the plating treatment portion 24, and the n-side electrode 31 is connected to the plating treatment portion 26 via the wires 32.

(Sealing of the LED Elements)

As shown in FIG. 4(d), for example, a dispenser (not shown) is used to inject a silicone base liquid resin as the sealing member 4 to the element assembling mounting substrate 5, followed by curing of the liquid resin. As a result, multiple LED elements 3 are sealed by the sealing member 4 on the element assembling mounting substrate 5.

(Dicing)

As shown in FIG. 4(e), for example, a rotary type dicing blade (not shown) is used to cut the sealing member 4 and the element assembling mounting substrate 5 to units with each unit comprising a LED element 3 and the conductor pads 22, 23, so that the units are divided from each other. As a result, multiple (210 in total) light emitting devices 1 (only one is shown in FIG. 4(e)) each having a LED element 3 mounted on the element-mounting substrate 2 and with the sealing member 4 exposed from the side surface are obtained.

(Effects of Embodiment 1)

The Embodiment 1 of the present invention has the following effects.

Because the conductor pad 22 among the multiple pairs of conductor pads 22, 23 is a pad for element mounting and wire connecting, it is possible to realize high density mounting of LED elements 3 on the element assembling mounting substrate 5. In addition, because it is possible to use the element assembling mounting substrate 5 as a vessel that allows injection of the liquid resin as the sealing member 4, there is no need to use a complicated equipment as would be needed in the prior art in manufacturing the light emitting devices 1. As a result, it is possible to avoid the obstacle to low cost in manufacturing of the light emitting devices 1.

(Embodiment 2)

Figure 3:
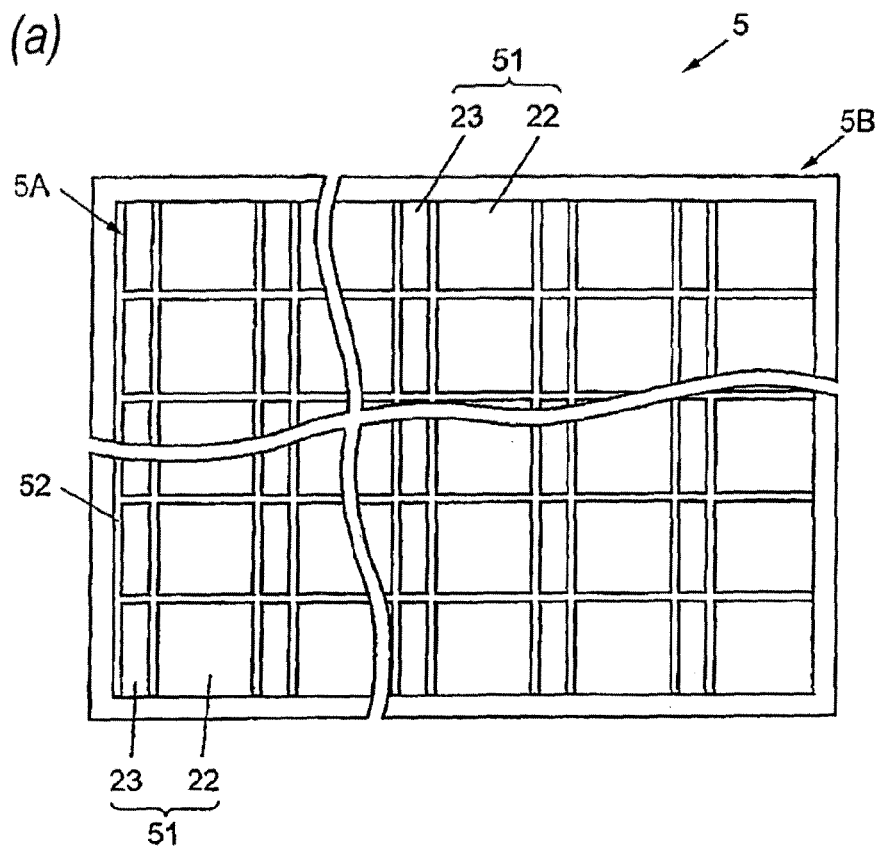
FIGS. 3(a) and 3(b) are plane view and cross-sectional view illustrating the element assembling mounting substrate related to Embodiment 1 of the present invention.
Figure 3:
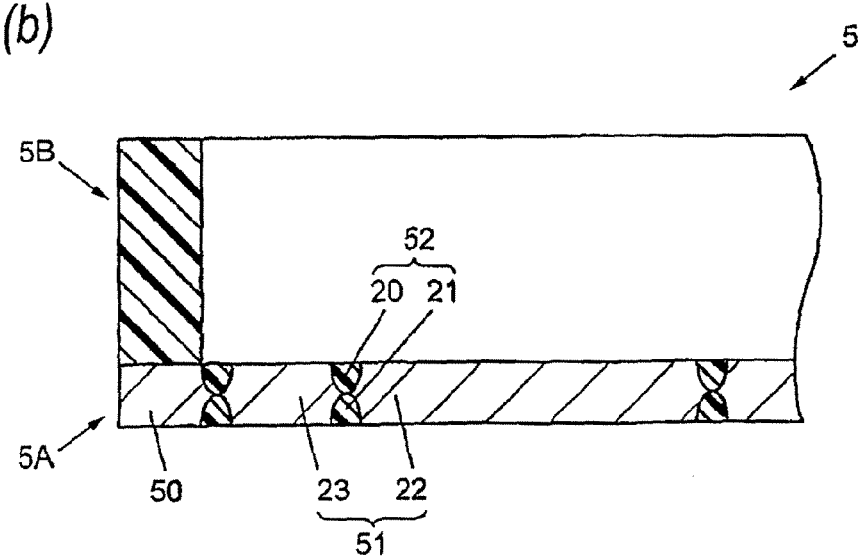
Figure 4:
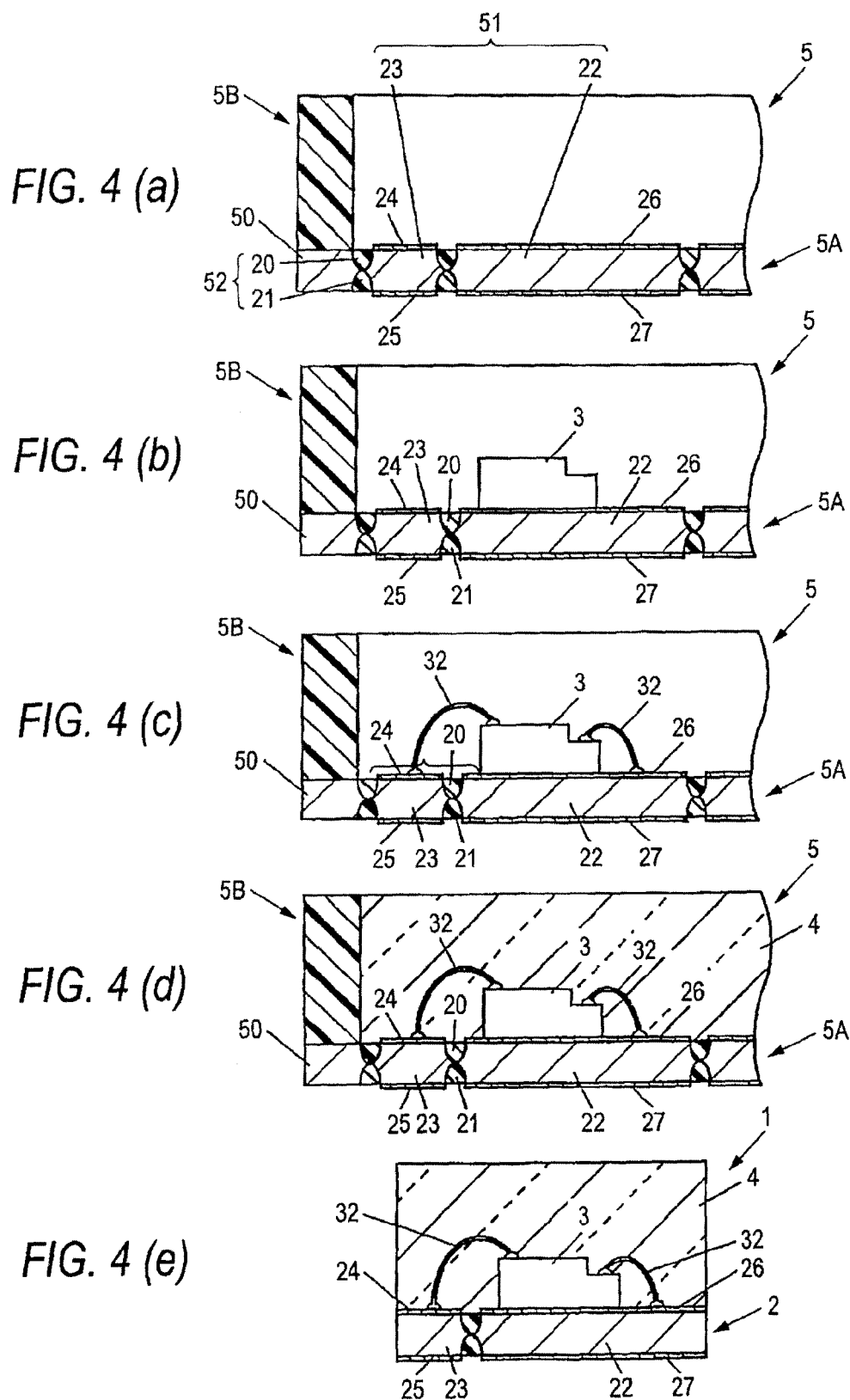
FIGS. 4(a) through 4(e) are cross-sectional views illustrating the manufacturing method of the light emitting devices using the element assembling mounting substrate related to Embodiment 1 of the present invention.
Figure 5:
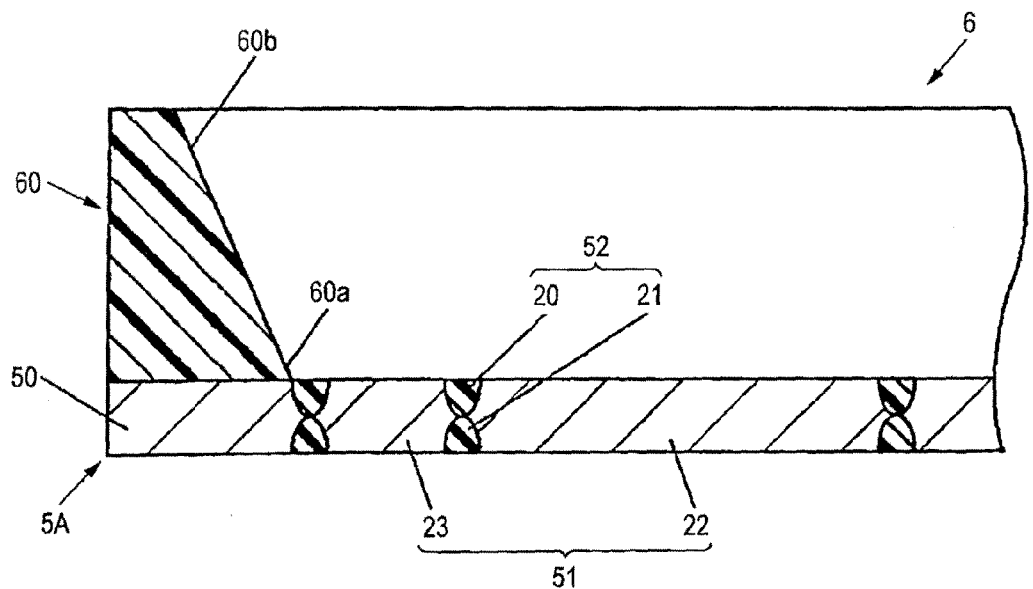
FIG. 5 is a cross-sectional view illustrating the element assembling mounting substrate related to Embodiment 2 of the present invention.

In the following, the element assembling mounting substrate related to Embodiment 2 of the present invention will be explained with reference to FIG. 5. FIG. 5 is a diagram illustrating the element assembling mounting substrate. In FIG. 5, the same keys as those in FIGS. 1 through 3 are adopted to represent the identical or equivalent members, and no detailed explanation will be repeated for them.

As shown in FIG. 5, Embodiment 2 of the present invention has the following characteristic feature for the element assembling mounting substrate 6: it has a frame member 60 that can suppress residual bubbles generated in the interior when LED elements 3 are sealed in the manufacturing process of the light emitting devices 1 (shown in FIG. 1).

For this purpose, the frame member 60 is designed to have an opening size that gradually tapers larger from the opening portion 60*a* on the side of the base member 50 among the two openings to the other opening portion 60*b*. As a result, when light emitting devices 1 are manufactured (when LED elements 3 are sealed), the bubbles generated inside the element assembling mounting substrate 5 can easily move along the inner surface of the frame member 60 from the opening portion 60*a* on the side of the base member 50 to the other opening portion 60*b*.

Consequently, according to the present embodiment, the bubbles generated within the element assembling mounting substrate 6 when the LED elements 3 are sealed can move along the inner surface of the frame member 60 and are released outside the element assembling mounting substrate 6.

(Effects of Embodiment 2)

The Embodiment 2 has the following effects in addition to the effects of Embodiment 1.

When the element assembling mounting substrate 6 is used in manufacturing light emitting devices 1, it is possible to suppress residual bubbles within the element assembling mounting substrate 6 when the LED elements 3 are sealed.

(Embodiment 3)

Figure 6:
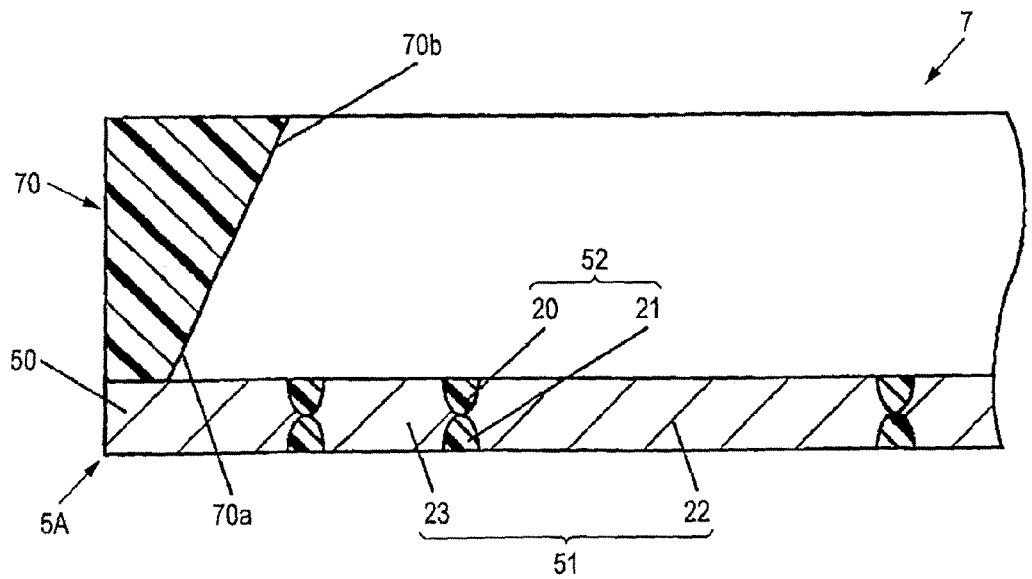
FIG. 6 is a cross-sectional view illustrating the element assembling mounting substrate related to Embodiment 3 of the present invention.

The element assembling mounting substrate related to Embodiment 3 of the present invention will be explained in the following sections with reference to FIG. 6. FIG. 6 is a diagram illustrating the element assembling mounting substrate. FIG. 6 adopts the same keys as those in FIGS. 1 through 3 to represent the identical or equivalent members, so detailed explanation thereof will be omitted.

As shown in FIG. 6, the element assembling mounting substrate 7 in Embodiment 3 of the present invention has a characteristic feature that it has a frame member 70 with a function in suppressing peeling of the sealing member 4 (shown in FIG. 1) after sealing of the LED elements 3 in manufacturing of the light emitting devices 1 (shown in FIG. 1).

For this purpose, the frame member 70 has an opening size designed to gradually taper smaller from the opening portion 70*a* on the side of the base member 50 among the two openings to the other opening portion 70*b*. As a result, in the manufacturing operation of the light emitting devices 1 (as the LED elements 3 are sealed), various side surfaces 4*b* of the sealing member 4 are covered by the inner surfaces of the frame member 70.

Consequently, according to the present embodiment, when a force for peeling from the substrate feed material 5A is applied on the sealing member 4 after manufacturing of light emitting devices 1 (after sealing of the LED elements 3), movement of the sealing member 4 from the opening portion 70*a* on the side of the base member 50 towards the other opening portion 70*b* can be limited, so that peeling movement of the sealing member 4 can be stopped by the inner surfaces of the frame member 70.

(Effects of Embodiment 3)

According to Embodiment 3 with the constitution, the following effects can be realized in addition to the effects of Embodiment 1.

When the element assembling mounting substrate 7 is used in manufacturing light emitting devices 1, it is possible to prevent peeling of the sealing member 4 from the substrate feed material 5A after sealing of the LED elements 3.

(Embodiment 4)

Figure 7:
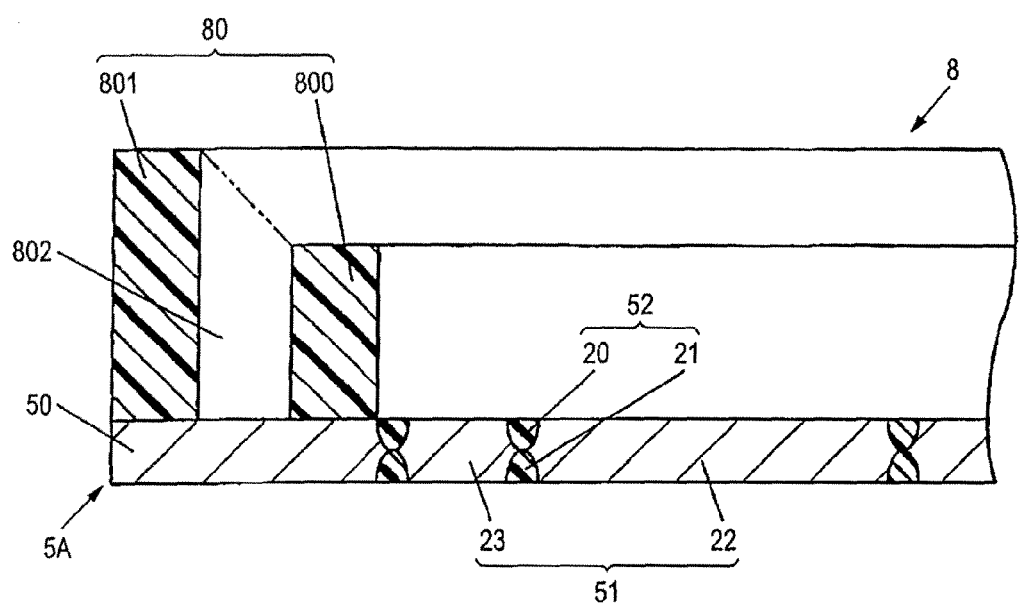
FIG. 7 is a cross-sectional view illustrating the element assembling mounting substrate related to Embodiment 4 of the present invention.

The element assembling mounting substrate related to Embodiment 4 of the present invention will be explained in the following sections with reference to FIG. 7. FIG. 7 is a diagram illustrating the element assembling mounting substrate. FIG. 7 adopts the same keys as those in FIGS. 1 through 3 to represent the identical or equivalent members, so detailed explanation thereof will be omitted.

As shown in FIG. 7, the element assembling mounting substrate 8 in Embodiment 4 of the present invention has a characteristic feature that it has a frame member 80 with the following function: after sealing of the LED elements 3 in the manufacturing operation of the light emitting devices 1 (shown in FIG. 1), the end surface of the sealing member 4 (the end surface on the side opposite to the end surface of the element-mounting substrate 2 on the element-mounting surface side) is formed as a flat surface.

For this purpose, the frame member 80 has two wall portions 800, 801 (inner wall portion 800 and outer wall portion 801), and, among these two inner/outer two wall portions 800, 801, the height of the inner wall portion 800 is selected to be shorter than the height of the outer wall portion 801. As a result, an annular groove 802 with nearly a pentagonal cross-sectional shape (trapezium) is formed between the inner wall portion 800 and the outer wall portion 801, so that when light emitting devices 1 are manufactured (when LED elements 3), the material of the sealing member 4 injected into the inner wall portion 800 of the element assembling mounting substrate 8 becomes full. Then, if the liquid resin is further injected to within the inner wall portion 800 in this full state, the liquid resin overflows the inner wall portion 800 into the annular groove 802.

Consequently, according to the present embodiment, when light emitting devices 1 are manufactured (when LED elements 3 are sealed), it is possible to ensure that the liquid resin to become sealing member 4 can be cured while its surface is in a level shape within the inner wall portion 800.

(Effects of Embodiment 4)

According to Embodiment 4 with the constitution, the following effect can be realized in addition to the effects of Embodiment 1.

After sealing of the LED elements 3 in the manufacturing operation of the light emitting devices 1, the end surface 4*a* of the sealing member 4 (shown in FIG. 1) can be formed as a flat surface.

The present embodiment has been explained above with respect to the example wherein an annular groove 802 with a nearly trapezium cross-sectional shape is formed between the inner wall portion 800 and the outer wall portion 801. However, the present invention is not limited to the configuration. For example, as shown in FIG. 8(*a*), which illustrates a modified example, it is also possible to form an annular groove 803 with a nearly triangle shape and an annular groove 804 with a nearly U-shaped cross-section between the inner wall portion 800 and the outer wall portion 801.

Figure 8:
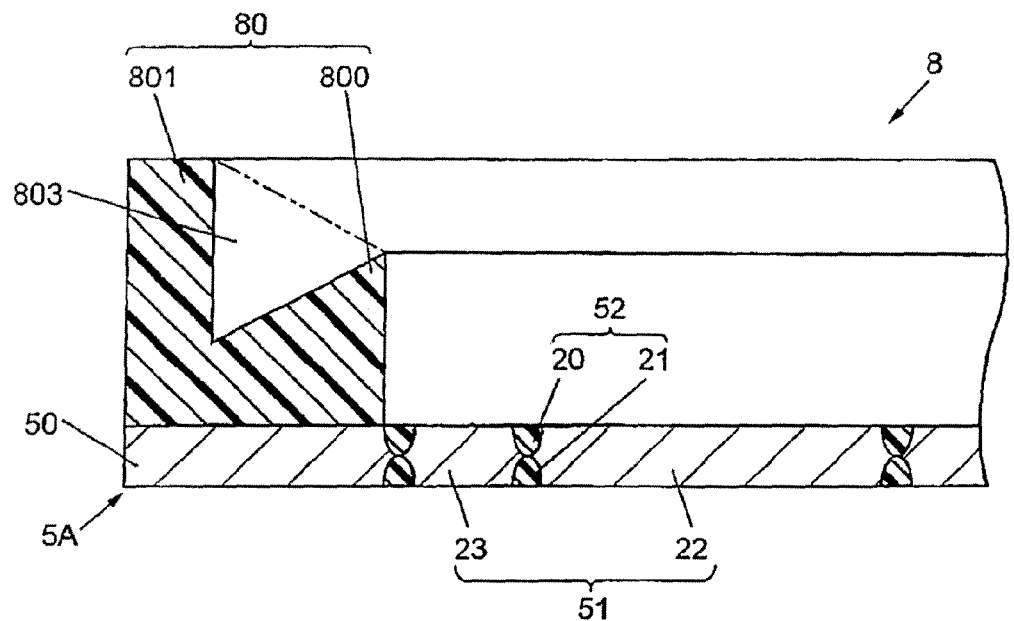
FIGS. 8(a) and 8(b) are cross-sectional views illustrating Modified Examples 1 and 2 of the element assembling mounting substrate related to Embodiment 4 of the present invention.
Figure 8:
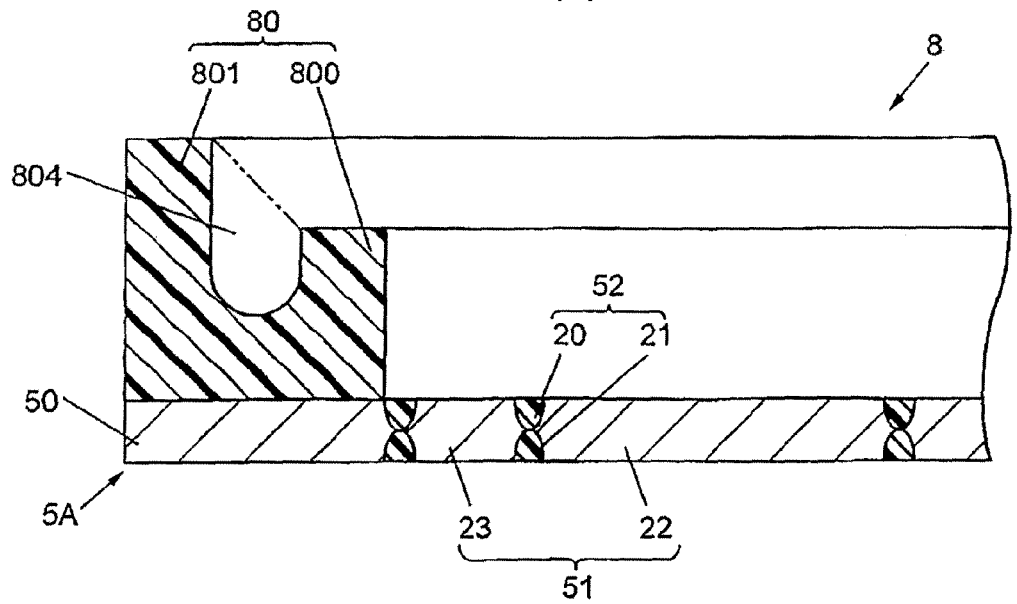

As a result, when the light emitting devices 1 are manufactured (when the LED elements 3 are sealed), the liquid resin within the inner wall portion 800 can overflow into the annular groove 803 as shown in FIG. 8(*a*) or into the annular groove 804 as shown in FIG. 8(*b*).

(Embodiment 5)

Figure 9:
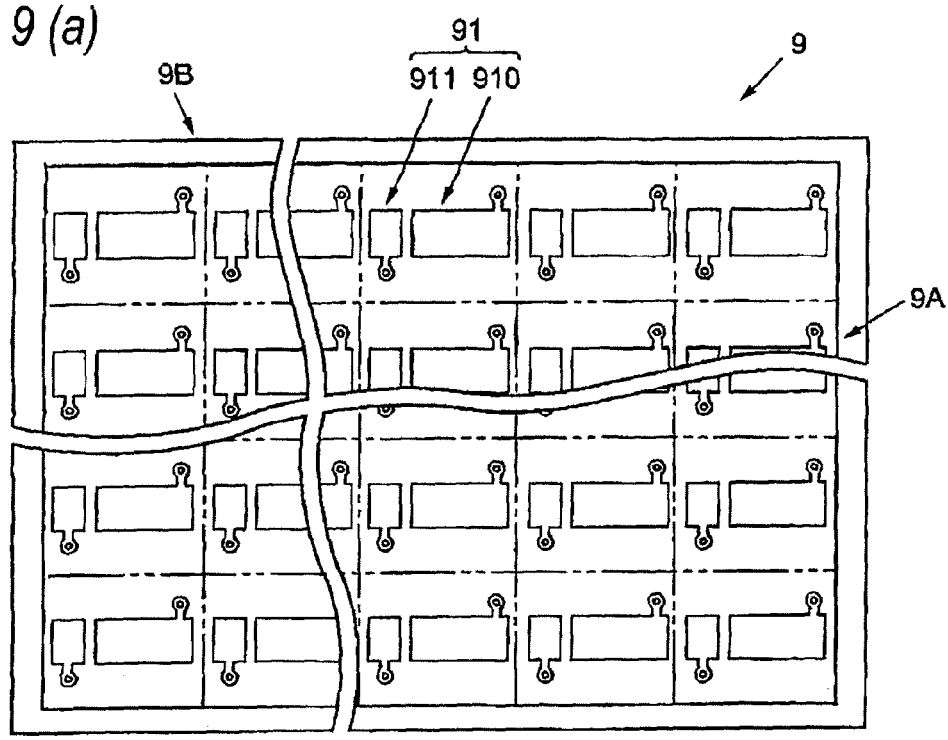
FIGS. 9(a) and 9(b) are a plane view and a cross-sectional view illustrating the element assembling mounting substrate in Embodiment 5 of the present invention.
Figure 9:
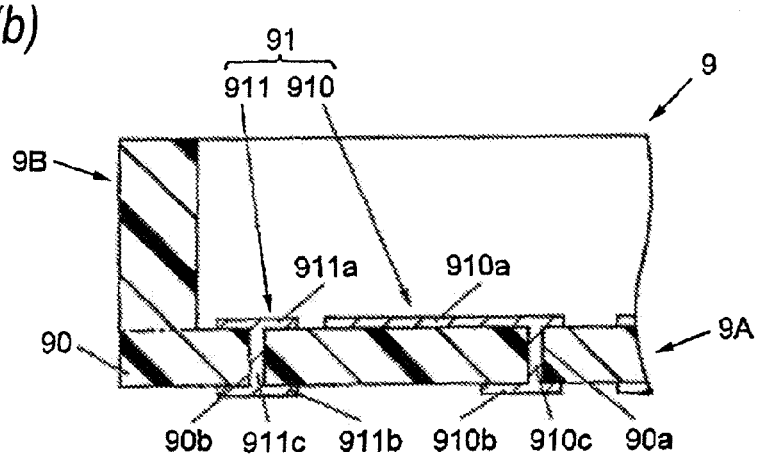

The element assembling mounting substrate related to Embodiment 5 of the present invention will be explained in the following sections with reference to FIG. 9. FIG. 9 is a diagram illustrating the element assembling mounting substrate. FIG. 9 adopts the same keys as those in FIGS. 1 through 3 to represent the identical or equivalent members, so the detailed explanation thereof will be omitted.

As shown in FIG. 9, the element assembling mounting substrate 9 in Embodiment 5 of the present invention has a characteristic feature that base member 90 is formed as an insulating member.

For this purpose, the element assembling mounting substrate 9 comprises a substrate feed material 9A with an insulating member as a base and a frame member 9B, and it is formed as a box member with a planar rectangular shape opening to one side for the entirety. As a result, just as the element assembling mounting substrate 5 in Embodiment 1, it is possible to inject the liquid resin as the sealing member 4 onto the element assembling mounting substrate 9 when light emitting devices 1 (shown in FIG. 1) are manufactured.

Here, the substrate feed material 9A has a base member 90 and a conductor member 91, and it is formed as a plate member with an overall planar rectangular shape.

For example, the base member 90 is formed by laminating a ceramic sheet of aluminum oxide ($Al_2O_3$). The material of the base member 90 may be aluminum nitride (AlN) or other ceramic material.

The conductor member 91 comprises multiple pairs (for example, 14 pairs in the longitudinal direction and 15 pairs in the lateral direction) of conductor pattern portions 910, 911 insulated from each other by base member 90, and these conductor pattern portions are arranged on the substrate feed material 9A. The multiple pairs of the conductor pattern portions 910, 911 are arranged side-by-side in the lateral and longitudinal directions on the plane.

One conductor pattern portion 910 [in each pair] works as an element-mounting/wire connecting pad, and it comprises an outer surface pattern 910a connected to the n-side electrode 31 of the LED element 3 (shown in FIG. 1), a back surface pattern 910b for feeding the power supply voltage to the LED element 3 (shown in FIG. 1), and via-pattern 910c that fills the interior of the via-hole 90a through the base member 90 to connect the outer surface pattern 910a and the back surface pattern 910b with each other.

The other conductor pattern portion 911 works as a wire connecting pad, and it comprises an outer surface pattern 911a connected to the p-side pad electrode 30a of the LED element 3 (shown in FIG. 1), a back surface pattern 911b for feeding the power supply voltage to the LED element 3 (shown in FIG. 1), and via-pattern 911c that fills the interior of the via-hole 90b through the base member 90 to connect the outer surface pattern 911a and the back surface pattern 911b with each other.

The outer surface pattern 910a and back surface pattern 910b are formed monolithically on the via-pattern 910c, and the outer surface pattern 911a and back surface pattern 911b are formed monolithically on the via-pattern 911c, respectively, from tungsten (W), molybdenum (Mo) or other high melting point metal.

A single or multiple metal layers may be formed on the surfaces of the outer surface pattern 910a, outer surface pattern 911a, as well as back surface pattern 910b, back surface pattern 911b, as needed from such materials as nickel (Ni), aluminum (Al), platinum (Pt), titanium (Ti), gold (Au), silver (Ag), copper (Cu), etc.

The frame member 9B is arranged on the 4-side end edge of the base member 90. Its entirety is formed by laminating aluminum oxide ($Al_2O_3$) or other ceramic sheet in the same way as the base member 90. Formation of the frame member 9B is carried out by sintering together with the base member 90.

(Manufacturing Method of the Light Emitting Devices 1)

The manufacturing method of light emitting devices 1 using the element assembling mounting substrate 9 shown in the embodiment of the present invention will be explained in the following sections with reference to FIGS. 10(a)-(d). Here, FIG. 4 [sic, 10](a)-(d) illustrate the manufacturing procedure of the light emitting devices.

Various steps of operation, namely, "mounting of LED elements", "wire bonding", "sealing of LED elements", and "dicing", are carried out sequentially in the manufacturing method of the light emitting devices shown in the present embodiment. Consequently, these steps of operation will be explained in order in the following sections.

(Mounting of LED Elements)

As shown in FIG. 10(a), for example, an electroconductive adhesive containing silver powder (not shown) is used to bond the LED elements 3 on the outer surface pattern 910a of the element assembling mounting substrate 9. In this case, bonding of the LED elements 3 is carried out such that the light output side is oriented from the p-side pad electrode 30a and the n-side electrode 31 (both shown in FIG. 1). As a result, multiple (a total of 210=14 in the longitudinal direction×15 in the lateral direction in the present embodiment) LED elements 3 are mounted.

(Wire Bonding)

As shown in FIG. 10(b), for example, an electro-conductive adhesive containing silver powder is used to connect each LED element 3 to the outer surface pattern 910a on the conductor pattern portion 910 and the outer surface pattern 911a on the conductor pattern portion 911 by means of wires 32. In this case, the p-side pad electrode 30a is connected to the outer surface pattern 911a, and the n-side electrode 31 is connected to the outer surface pattern 910a, respectively, via the wires 32.

(Sealing of the LED Elements)

As shown in FIG. 10(c), for example, a dispenser (not shown) is used to inject a silicone base liquid resin as the sealing member 4 into within the element assembling mounting substrate 9, followed by curing of the liquid resin. As a result, multiple LED elements 3 are sealed by the sealing member 4 on the element assembling mounting substrate 9.

(Dicing)

As shown in FIG. 10(d), for example, a rotary type dicing blade (not shown) is used to cut the sealing member 4 and the element assembling mounting substrate 9 to units with each unit comprising a LED element 3 and the conductor pads 910, 911, so that the units are divided from each other. As a result, multiple (210 in total) light emitting devices 1 each having an LED element 3 mounted on the element-mounting substrate 2 are obtained.

(Effects of Embodiment 5)

According to Embodiment 5 with the configuration, the following effect can be realized in addition to the effects of Embodiment 1.

Because the element assembling mounting substrate 9 where the circuit pattern (outer surface pattern 910a, outer surface pattern 911a, back surface pattern 910b, back surface pattern 911b, as well as via-pattern 910c, via-pattern 911c) pre-formed thereon is used in manufacturing light emitting device 1, it is possible to cut the number of the steps of the manufacturing operation, and it is possible to cut the manufacturing cost.

The manufacturing method of the light emitting devices of the present invention has been explained above with reference to the embodiments. However, the present invention is not limited to the embodiments. Various modifications may be adopted in the embodiment of the present invention as long as the gist of the present invention is observed.

(1) In the embodiments, the LED element 3 is mounted in the so-called face-up configuration, and wires 32 are used to connect the conductor pads 22, 23 or conductor pattern portions 910, 911. However, the present invention is not limited to the constitution. It may be possible that the LED element 3 is mounted in the so-called face-down configuration, and metal bumps are used to connect the conductor pads 22, 23 or the conductor pattern portions 910, 911.

(2) In the embodiments, the sealing member 4 and the element assembling mounting substrate 5 or 9 are cut to obtain light emitting devices 1 each having a single LED element 3. However, the present invention is not limited to the configuration. It may be also possible that the sealing member 4 and the element assembling mounting substrate 5 or 9 are cut to obtain light emitting devices 1 each having multiple LED elements 3.

What is claimed is:

1. A manufacturing method of light emitting devices, said method comprising:
    forming a planar-shaped substrate comprising a plurality of insulating members extending in a thickness direction of the substrate;
    forming a closed frame on the substrate;
    mounting multiple light emitting elements in an inside of the frame;
    injecting a liquid material comprising a sealing member to the inside of the frame so as to seal the multiple light emitting elements; and
    dividing the sealing member in the inside of the frame together with the substrate so as to obtain multiple light emitting devices with the sealing member exposed from a side surface thereof,
    wherein, in said dividing, one of the plurality of the insulating members, located between the closed frame and one of the multiple light emitting devices adjacent to the closed frame, is cut off from said one of the multiple light emitting devices, and
    wherein the forming the planar-shaped substrate and the forming the closed frame on the substrate are carried out simultaneously.

2. The manufacturing method of light emitting devices according to claim 1, wherein the substrate includes a resin composite lead frame.

3. The manufacturing method of light emitting devices according to claim 2, wherein the frame gradually tapers larger from a side of the substrate.

4. The manufacturing method of light emitting devices according to claim 2, wherein the frame gradually tapers smaller from a side of the substrate.

5. The manufacturing method of light emitting devices according to claim 2, wherein the frame comprises two wall portions, said two wall portions comprising an inner wall portion and an outer wall portion.

6. The manufacturing method of light emitting devices according to claim 1, wherein the substrate comprises a substrate feed material and the frame.

7. The manufacturing method of light emitting devices according to claim 1, wherein the frame comprises an inner wall portion and an outer wall portion.

8. The manufacturing method of light emitting devices according to claim 7, wherein a height of the inner wall portion is less than a height of the outer wall portion.

9. The manufacturing method of light emitting devices according to claim 7, further comprising forming an annular groove between the inner wall portion and the outer wall portion.

10. The manufacturing method of light emitting devices according to claim 1, wherein the sealing member comprises a silicone base optical transmissive resin.

11. The manufacturing method of light emitting devices according to claim 1, wherein the sealing member comprises an optically transparent acrylic resin.

12. The manufacturing method of light emitting devices according to claim 1, wherein, in said dividing, another one of the plurality of the insulating members is held with each of the multiple light emitting devices, and
    wherein, in the thickness direction of the substrate, an edge of the closed frame overlaps with an edge of said one of the plurality of the insulating members.

13. The manufacturing method of light emitting devices according to claim 1, further comprising:
    metal plating a surface of the substrate, the substrate comprising a conductor,
    wherein another one of the plurality of the insulating members is held with each of the multiple light emitting devices to insulate a first portion of the metal plated surface and the conductor of the substrate from a second portion of the metal plated surface and the conductor of the substrate.

14. A method of manufacturing light emitting devices, said method comprising:
    simultaneously forming a planar-shaped substrate and a frame on said substrate, the substrate comprising a plurality of insulating members extending in a thickness direction of the substrate;
    mounting a plurality of light emitting elements in an inside of the frame;
    forming a sealing member in the inside of the frame to seal the plurality of light emitting elements; and
    dividing both the sealing member and the substrate to form a plurality of light emitting devices, said dividing exposing a side surface of a respective sealing member,.
    wherein, in said dividing, one of the plurality of the insulating members, located between the frame and one of the multiple light emitting devices adjacent to the frame, is cut off from said one of the multiple light emitting devices.

15. The method according to claim 14, wherein said forming said substrate comprises:
    forming a base member;
    forming a plurality of conductor members on the base member; and
    forming the insulating members configured to insulate the plurality of conductor members from each other, and
    wherein said forming said frame comprises forming a closed frame.

16. The method according to claim 15, wherein a frame member is bonded to said base member, said frame member having a planar shape identical to a planar shape of the base member.

17. The method according to claim 14, wherein said forming the frame comprises forming an inner wall portion and an outer wall portion.

18. The method according to claim 17, wherein a height of the inner wall portion is less than a height of the outer wall portion.

19. The method according to claim 14, wherein said forming the sealing member comprises injecting a liquid resin into said frame.

20. A method of manufacturing light emitting devices, said method comprising:
- simultaneously forming a substrate and a frame on said substrate;
- mounting a plurality of light emitting elements in an inside of the frame;
- forming a sealing member in the inside of the frame to seal the plurality of light emitting elements; and
- dividing both the sealing member and the substrate to faun a plurality of light emitting devices, said dividing exposing a side surface of a respective sealing member,
- wherein said forming the frame comprises forming an inner wall portion and an outer wall portion, and
- wherein a height of the inner wall portion is less than a height of the outer wall portion.

* * * * *